United States Patent
Eggers et al.

(10) Patent No.: US 8,314,614 B2
(45) Date of Patent: Nov. 20, 2012

(54) PROPELLER MRI WITH PHASE CORRECTION

(75) Inventors: Hoger Eggers, Ellerhoop (DE); Gerrit Van Ijperen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 383 days.

(21) Appl. No.: 12/598,445

(22) PCT Filed: Apr. 25, 2008

(86) PCT No.: PCT/IB2008/051603
§ 371 (c)(1),
(2), (4) Date: Nov. 2, 2009

(87) PCT Pub. No.: WO2008/135885
PCT Pub. Date: Nov. 13, 2008

(65) Prior Publication Data
US 2010/0117645 A1 May 13, 2010

(30) Foreign Application Priority Data
May 3, 2007 (EP) .................................. 07107438

(51) Int. Cl.
*G01V 3/00* (2006.01)
(52) U.S. Cl. ....................................... 324/307; 324/309
(58) Field of Classification Search .......... 324/300–322; 600/407–445
See application file for complete search history.

(56) References Cited

U.S. PATENT DOCUMENTS 7,023,207 B1 4/2006 Gaddipati et al.
7,030,609 B2 4/2006 Pipe
7,132,826 B1 11/2006 Jung et al.
7,205,763 B2 * 4/2007 Porter ........................... 324/306

(Continued)

FOREIGN PATENT DOCUMENTS
EP 1911499 A1 4/2008
WO 2007013423 A1 2/2007

OTHER PUBLICATIONS

Barkauskas, K. J., et al.; Centering the Trajectory in Radial TrueFISP Imaging: Comparing Gradient Delay Modeling and Phase Correction Strategies; 2005; Proc. Intl. Soc. Mag. Reson. Med.; 13:2287.

(Continued)

*Primary Examiner* — Brij Shrivastav

(57) ABSTRACT

A device for MRI of a body (7) placed in an examination volume includes a main magnet (2) for establishing a substantially homogeneous main magnetic field in the examination volume. Gradient coils (3, 4, 5) generate switched magnetic field gradients superimposed upon the main magnetic field. An RF antenna (6) radiates RF pulses towards the body (7). A control system (12) controls the generation of the magnetic field gradients and the RF pulses. A demodulator (10) receives and samples MR signals. A computer (14) forms MR images from the signal samples. The computer (1) is arranged to generate a series of MR signals by subjecting at least a portion of the body (7) to an MRI sequence, to acquire the MR signals as a plurality of k-space blades according to the PROPELLER scheme, to compute phase errors from the phase differences of pairs of k-space blades having different rotation angles, to perform a phase correction of the acquired k-space blades on the basis of the computed phase errors, and to reconstruct an MR image from the acquired and phase-corrected MR data set.

19 Claims, 2 Drawing Sheets

U.S. PATENT DOCUMENTS

| | | | |
|---|---|---|---|
| 7,372,269 B2 * | 5/2008 | Takizawa et al. | 324/309 |
| 7,408,345 B2 * | 8/2008 | Bammer et al. | 324/307 |
| 7,840,049 B2 * | 11/2010 | Stemmer | 382/131 |
| 2005/0073303 A1 | 4/2005 | Harer et al. | |
| 2006/0116569 A1 | 6/2006 | Yamazaki | |
| 2010/0079141 A1 * | 4/2010 | Stemmer | 324/309 |

OTHER PUBLICATIONS

Barkauskas, K. J., et al.; TrueFISP Blade Imaging in the Steady State (TrueBLISS); 2006; Proc. Intl. Soc. Mag. Reson. Med.; 14:3380.

Bernstein, M. A., et al.; Handbook of MRI pulse sequences; 2004; Elsevier Academic Press; pp. 915-927.

Chang, H. C., et al.; PROPELLER EPI with Reversed Gradient Method for High Resolution DTI at 3.0T without Field-map Correction; 2006; Proc. Intl. Soc. Mag. Reson. Med.; 14:1056.

Devaraj, A., et al.; An Enhanced Phase correction Algorithm for PROPELLER DW MRI; 2006; Proc. Intl. Soc. Mag. Reson. Med.; 14: 2956.

Eggers, H., et al.; Preserving Phase Information in Propeller Imaging; 2007; Proc. Intl. Soc. Mag. Reson. Med.; 15:1735.

Pipe, J. G., et al.; Multishot Diffusion-Weighted PSE Using PROPELLER MRI; 2002; Magnetic Resonance in Medicine; 47:42-52.

Pipe, J. G.; Motion correction with PROPELLER MRI: Application to Head Motion and Free-Breathing Cardiac Imaging; 1999; Magnetic Resonance in Medicine; 42:963-969.

Rasche, V., et al.; MR Fluoroscopy Using Projection Reconstruction Multi-Gradient-Echo (prMGE) MRI; 1999; Magnetic Resonance in Medicine; 42:324-334.

* cited by examiner

PROPELLER MRI WITH PHASE CORRECTION

FIELD OF THE INVENTION

The invention relates to a device for magnetic resonance imaging (MRI) of a body placed in an examination volume.

Furthermore, the invention relates to a method for MRI and to a computer program for a magnetic resonance (MR) device.

BACKGROUND OF THE INVENTION

In MRI, pulse sequences consisting of radiofrequency (RF) pulses and switched magnetic field gradients are applied to an object (a patient) placed in a homogeneous magnetic field within an examination volume of an MR device. In this way, MR signals are generated, which are scanned by means of RF receiving antennas in order to obtain information about the object and to reconstruct images thereof. Since its initial development, the number of clinically relevant fields of application of MRI has grown enormously. MRI can be applied to almost every part of the body, and it can be used to obtain important functional information about the human body. The pulse sequence, which is applied during an MRI scan, plays a significant role in the determination of the characteristics of the reconstructed image, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

In the known so-called PROPELLER concept (Periodically Rotated Overlapping ParalEL Lines with Enhanced Reconstruction, see James G. Pipe: "Motion Correction With PROPELLER MRI: Application to Head Motion and Free-Breathing Cardiac Imaging", Magnetic Resonance in Medicine, vol. 42, 1999, pages 963-969), MR signals are acquired in k-space in N strips, each consisting of L parallel lines, corresponding to the L lowest frequency phase-encoding lines in a Cartesian k-space sampling scheme. Each strip, which is also referred to as k-space blade, is rotated in k-space by an angle $\delta\phi=180°/N$, so that the total MR data set approximately spans a circle in k-space. If a data matrix having a diameter M is desired, then L and N are, for instance, chosen so that $L \cdot N = M \cdot \pi/2$. One essential characteristic of PROPELLER is that a central circular portion in k-space, having a diameter L, is acquired for each k-space blade. This central portion can be used to reconstruct a low-resolution image for each k-space blade. These low-resolution images, or their k-space representations, are compared to each other to remove in-plane displacements, which are due to patient motion. In addition, a suitable technique such as cross-correlation is employed to determine which k-space blades are acquired with significant through-plane displacement. As the MR signals are combined in k-space before the reconstruction of the final MR image, the MR data from k-space blades with the least amount of through-plane motion are preferentially used in regions in which the k-space blades overlap, so that artifacts arising from through-plane motion are reduced. The PROPELLER technique makes use of oversampling in the central portion of k-space in order to obtain an MR image acquisition technique that is robust with respect to motion of the examined patient during MR signal acquisition.

A necessary step before combining the MR signals from the k-space blades is to make sure that the point of rotation is exactly at the center of k-space. This is generally not exactly true due to imperfections of the switched magnetic field gradients. These imperfections mainly result in phase errors of the acquired MR signals in image space. According to the conventional PROPELLER scheme, all low-frequency spatially varying phase in image space is simply removed completely from each k-space blade, simultaneously removing k-space translations and eliminating motion-related phase shifts which vary slowly over the MR image and may also vary from blade to blade.

A drawback of the conventional PROPELLER concept is that phase information of the acquired MR signals is mostly lost during the above-described phase correction procedure. This renders it impossible to reconstruct complex MR images, as it is required or at least desired for a lot of MR acquisition methods, such as, e.g., Inversion Recovery (IR). Moreover, the conventional approach gives rise to severe artifacts in magnitude MR images using certain MR acquisition methods, such as IR and Balanced Fast Field Echo (BFFE) sequences.

Therefore, it is readily appreciated that there is a need for an improvement of the known PROPELLER concept. It is consequently an object of the invention to provide an MR device that enables the generation of complex MR images with PROPELLER imaging and improves image quality in, among others, IR and Steady State Free Precession (SSFP) PROPELLER imaging.

SUMMARY OF THE INVENTION

In accordance with the present invention, an MR device for MRI of a body placed in an examination volume is disclosed. The device comprises means for establishing a substantially homogeneous main magnetic field in the examination volume, means for generating switched magnetic field gradients superimposed upon the main magnetic field, means for radiating RF pulses towards the body, control means for controlling the generation of the magnetic field gradients and the RF pulses, means for receiving and sampling MR signals, and reconstruction means for forming MR images from the signal samples. The invention proposes that the device is arranged to a) generate a series of MR signals by subjecting at least a portion of the body to an MRI sequence of at least one RF pulse and switched magnetic field gradients, b) acquire the MR signals as a plurality of k-space blades according to the PROPELLER scheme, the k-space blades being rotated about a center of k-space, c) compute phase errors from the phase differences of two or more k-space blades having different rotation angles, d) perform a phase correction of the acquired k-space blades on the basis of the computed phase errors, and e) reconstruct an MR image from the acquired and phase-corrected MR data set.

The essential feature of the invention is the computation of phase errors from the phase differences of two or more k-space blades having different rotation angles and the corresponding correction of the phases of the MR signals. The phase errors may be computed in image space, equivalent calculations may be performed in k-space or in a hybrid space. Phase errors due to the gradient system of the MR device can be removed in this way while preserving the complete phase information of the MR signals. Hence, the technique of the invention enables the reconstruction of complex MR images (including real, imaginary or phase images) from the MR signal data set acquired using PROPELLER and avoids image artifacts arising from the removal of most phase information as in the known PROPELLER concept.

Preferably, the MR device of the invention is further arranged to compute the phase errors from the phase differences of pairs of k-space blades having (nearly or exactly) opposed rotation angles. The phase errors of the MR data from k-space blades having a difference in the rotation angle of 180° are identical except for their signs, since the readout magnetic field gradients reverse their polarity. It is thus a straightforward computation to determine the phase errors for pairs of k-space blades having opposed readout directions. However, the technique of the invention does not require additional scan time, since an exact 180° difference in rotation angle of the k-space blades is not required to extract the phase errors with sufficient precision. A re-acquisition of k-space samples is not necessary to practically execute the technique of the invention. Preferably, adjacent k-space blades are acquired according to the invention with nearly or exactly opposed readout and/or preparation directions.

According to a further preferred embodiment of the invention, the MR device may be arranged to compute amplitude errors from the amplitude differences of two or more k-space blades having different rotation angles. These calculations may be performed in image space or by equivalent calculations in k-space or a hybrid space. Image artifacts can be further reduced in this way.

In a preferred embodiment of the invention, the means for receiving the MR signals comprises two or more receiving coils, wherein the MR device is arranged to combine complex MR data sets acquired via the different receiving coils in parallel. Since the technique of the invention allows the preservation of the complete phase information of the acquired MR signals, it can be used for parallel MR methods (such as, e.g, CLEAR or SENSE) in which complex MR data sets acquired via different receiving coils are combined during image reconstruction.

According to a further preferred embodiment of the invention, the MR imaging sequence applied for PROPELLER acquisition is a BFFE or an IR sequence. Both in BFFE and in IR imaging, large local phase variations may occur, due to different relaxation time constants or field inhomogeneity. These lead to substantial artifacts in magnitude images if the phase information is largely removed, as by the conventional PROPELLER phase correction. In contrast, the invention allows the use of BFFE or IR sequences for PROPELLER acquisitions, because it preserves the phase information of the acquired MR signals and thus avoids these artifacts. For the same reason, the invention is advantageous for phase-contrast acquisitions and for gradient echo imaging in the presence of chemical shift, as in non-selective water and fat acquisitions.

The invention not only relates to a device but also to a method for MRI of at least a portion of a body placed in an examination volume of an MR device, wherein the method comprises the following steps:

a) generating a series of MR signals by subjecting at least a portion of the body to an MR imaging sequence of at least one RF pulse and switched magnetic field gradients, b) acquiring the MR signals as a plurality of k-space blades according to the PROPELLER scheme, the k-space blades being rotated about a center of k-space, c) computing phase errors from the phase differences of two or more k-space blades, d) performing a phase correction of the acquired k-space blades on the basis of the computed phase errors, and e) reconstructing an MR image from the acquired and phase-corrected MR data set.

A computer program adapted for carrying out the imaging procedure of the invention can advantageously be implemented on any common computer hardware, which is presently in clinical use for the control of MR scanners. The computer program can be provided on suitable data carriers, such as CD-ROM or diskette. Alternatively, it can also be downloaded by a user from an Internet server.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings

DETAILED DESCRIPTION OF THE EMBODIMENTS

Figure 1:
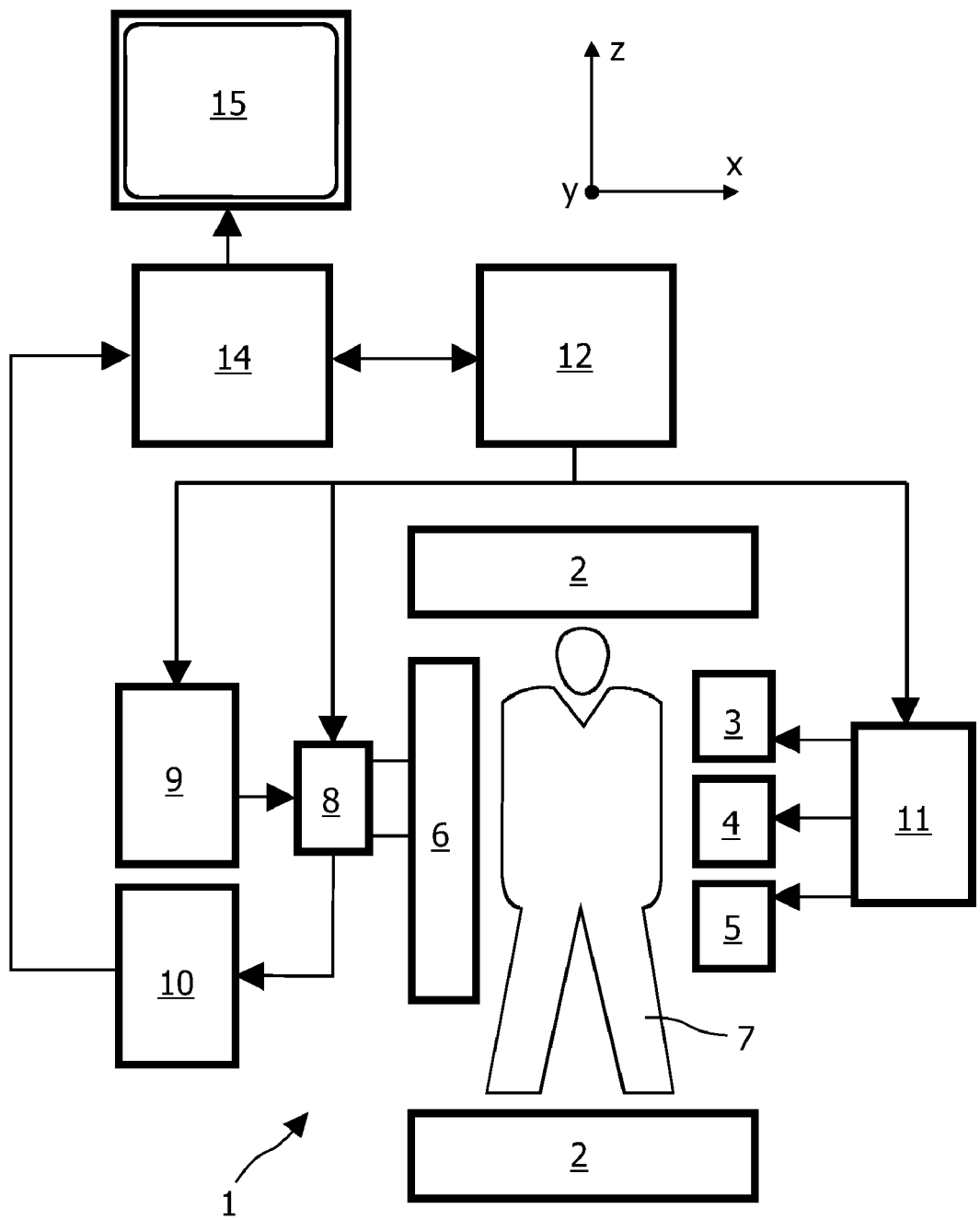
FIG. 1 shows an MR scanner according to the invention.

In FIG. 1 an MRI device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4 and 5 are energized via a power supply 11. The imaging device 1 further comprises an RF transmit antenna 6 for emitting RF pulses to a body 7. The antenna 6 is coupled to a modulator 9 for generating and modulating the RF pulses. Also provided is a receiver for receiving the MR signals, the receiver can be identical to the transmit antenna 6 or be separate. If the transmit antenna 6 and receiver are physically the same antenna as shown in FIG. 1, a send-receive switch 8 is arranged to separate the received signals from the pulses to be emitted. The antenna 6 can either be a single coil, such as, e.g., a body coil, or it can comprise a (phased) coil array for parallel acquisition of the MR signals via separate receiving coils. The received MR signals are input to a demodulator 10. The send-receive switch 8, the modulator 9, and the power supply 11 for the gradient coils 3, 4 and 5 are controlled by a control system 12. Control system 12 controls the phases and amplitudes of the RF signals fed to the antenna 6. The control system 12 is usually a microcomputer with a memory and a program control. The demodulator 10 is coupled to reconstruction means 14, e.g. a computer, for transformation of the received signals into images that can be made visible, e.g., on a visual display unit 15. For the practical implementation of the invention, the control system 12 of the MR device 1 comprises a programming for acquiring the MR signals as a plurality of k-space blades according to the PROPELLER scheme. The reconstruction means 14 is programmed to compute phase errors from the phase differences of pairs of k-space blades having different rotation angles, and to perform a phase correction of the acquired k-space blades on the basis of the computed phase errors before the final MR image is reconstructed from the phase-corrected MR signal data set.

Figure 2:
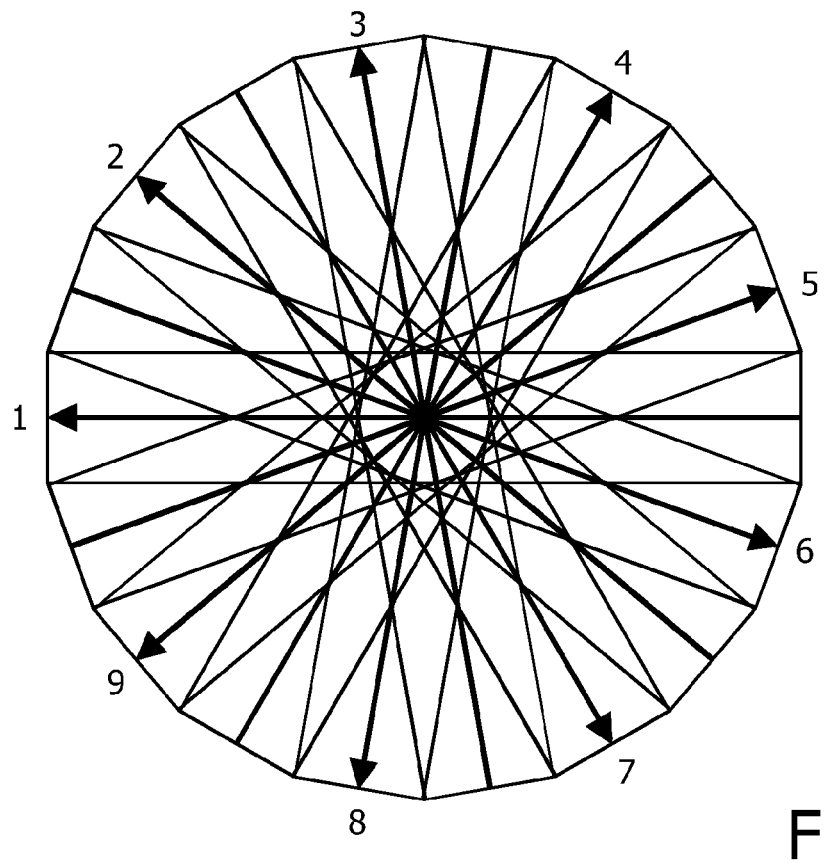
FIG. 2 illustrates the k-space sampling scheme of PROPELLER MRI with opposing readout directions.

FIG. 2 illustrates the k-space sampling of PROPELLER MRI according to the invention. In the example shown in FIG. 2, nine k-space PROPELLER blades are acquired. The blades are rotated about the center of k-space, so that the total acquired MR data set approximately spans a circle in k-space. The arrows shown in FIG. 2 indicate the directions of the readout magnetic field gradients generated for the respective k-space blades. The rotation angle of the successively acquired k-space blades is incremented in the depicted example by 40°. For example the k-space blades 1 and 6 form a pair having an approximately (160°) opposed readout direction. The phase errors of the MR data from these k-space blades can be estimated by computing the phase differences of the corresponding MR signal samples from the two blades in image space. The phase correction scheme of the invention relies on the phase differences between blades with nearly 180° difference in rotation angle but requires no additional scan time, because an exact 180° difference is not necessary in practice to estimate the phase errors with sufficient accuracy. The estimated phase errors are used in accordance with the invention to perform a phase correction of the MR signal samples acquired from the k-space blades, wherein the phase information of the MR signals is preserved.

Figure 3:
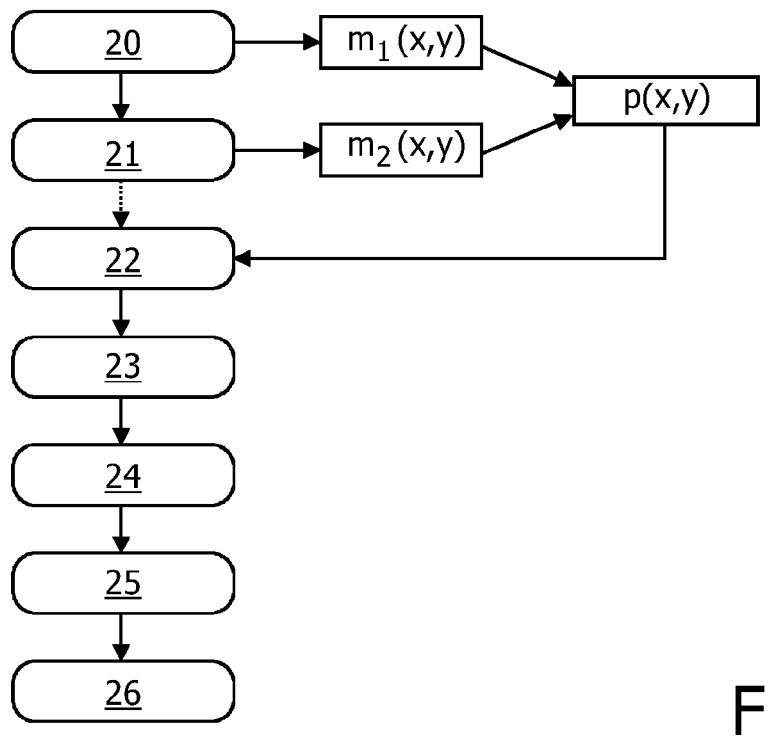
FIG. 3 shows a flow chart of the method of the invention.

In FIG. 3, the method of the invention is shown as a flow chart. The steps 20 and 21 each represent the acquisition of a single k-space blade, wherein the two k-space blades have nearly opposed rotation angles. The MR data from these two k-space blades are transformed to image space. The resulting image data sets are represented in FIG. 3 by $m_1(x, y)$ and $m_2(x, y)$. Steps 20 and 21 are repeated until k-space is completely sampled. The signals $m_1(x, y)$ and $m_2(x, y)$ ideally read $$m_1(x,y)=(m(x,y)*s(x,y))e^{+ip(x,y)} \text{ and}$$

$$m_2(x,y)=(m(x,y)*s(x,y))e^{-ip(x,y)},$$

wherein $m(x, y)$ denotes the magnetization as a function of the spatial coordinates x and y, $s(x, y)$ denotes the so-called k-space shutter function, which is basically a rotated sinc function determined by the width of the k-space blades in the phase-encoding direction, and $p(x, y)$ denotes the phase errors in image space. For approximately opposed readout directions, $s(x, y)$ is essentially identical for both k-space blades. $p(x, y)$ is also identical, except for its sign, since the readout gradients reverse their polarity. A separation of the gradient-caused $p(x, y)$ from the object and coil phases contained in $m(x, y)$ can be achieved by computing $$\sqrt{m_1(x,y)m_2^*(x,y)}=|m(x,y)*s(x,y)|e^{ip(x,y)}.$$

The gradient-induced linear phase shifts can be deduced directly from this formula, preferably with signal amplitude weighting. A corresponding phase correction of the k-space data is then performed in step 22. The readout and phase-encoding directions may be considered separately in this process. Other effects than a mere delay may be addressed as well by more elaborate non-linear phase corrections based on the above formula. Global motion of the examined patient, such as rigid body translation and rotation, does not substantially affect the phase correction in step 22. While a translation causes a linear phase shift in k-space, and not in image space, a rotation only changes the effective difference in angulation between two k-space blades. This reduces the accuracy of the estimation of $p(x, y)$ slightly. As mentioned above, an exact 180° difference in rotation angle will not be chosen in practice anyway, in order to avoid excessive re-acquisition of k-space samples and a corresponding increase in total scan time. After phase correction in step 22, bulk rotation of the examined object between each k-space blade is estimated and removed in step 23. Bulk translation is estimated and corrected for subsequently in step 24. In step 25, the rotated and translated MR signal data are correlated with each other. Poor correlation between k-space blades is assumed to correspond to significant through-plane motion of the examined object. The obtained correlation measures are used to prioritize the MR signal data from the individual k-space blades. The data are weighted unevenly, according to priority, in the overlapping areas of the k-space blades in order to minimize the contribution of motion-corrupted signals. Final reconstruction of the (complex) MR image takes place in step 26. This involves gridding the data and Fourier transforming the result.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A device for MRI of a body placed in an examination volume, the device comprising:
  main magnet coils configured for establishing a substantially homogeneous main magnetic field in the examination volume;
  gradient coils configured for generating switched magnetic field gradients superimposed upon the main magnetic field in the examination volume;
  an RF transmit antenna configured for radiating RF pulses towards the body;
  a control system configured for controlling the generation of the magnetic field gradients and the RF pulses;
  a demodulator configured for receiving and sampling MR signals; and
  one or more processors configured to:
    a) generate a series of MR signals by subjecting at least a portion of the body to an MRI sequence of at least one RF pulse and switched magnetic field gradients,
    b) acquire the MR signals as a plurality of k-space blades according to the PROPELLER scheme, the k-space blades being rotated about a center of k-space,
    c) compute phase errors from the phase differences of pairs of k-space blades having exactly or nearly opposed rotation angles,
    d) perform a phase correction of the acquired k-space blades on the basis of the computed phase errors to generate an acquired and phase-corrected MR data set, and
    e) reconstruct an MR image from the acquired and phase-corrected MR data set.

2. The device of claim 1, wherein the one or more processors are configured to reconstruct a complex MR image from the acquired and phase-corrected MR data set.

3. The device of claim 1, wherein the one or more processors are further programmed to compute the phase errors by performing the steps of:
  transforming the exactly or nearly opposite k-space blades to image space to generate image space data sets $m_1(x, y)$ and $m_2(x, y)$, wherein $$m_1(x,y)=(x,y)*s(x,y))e^{+ip(x,y)}$$

$$m_2(x,y)=(x,y)*s(x,y))e^{-ip(x,y)}$$

where $m(x, y)$ denotes magnetization as a function of spatial coordinates x and y, $s(x, y)$ denotes a k-space shutter function, and $p(x, y)$ denotes gradient-caused phase errors in image space;
  separating the gradient caused phase $p(x, y)$ from the body in the examination volume and coil phases contained in $m(x, y)$ by computing:

$$\sqrt{m_1(x,y)m_2^*(x,y)}=|m(x,y)*s(x,y)|e^{ip(x,y)}$$

where $m_2^*(x, y)$ is a complex conjugate of $m_2(x, y)$.

4. The device of claim 1, wherein the device is arranged to acquire adjacent k-space blades with nearly or exactly opposed readout and/or preparation directions.

5. The device of claim 1, wherein the one or more processors are configured to compute amplitude errors from the amplitude differences of two or more k-space blades having different rotation angles.

6. The device of claim 1, further including:
two or more receiving coils, the demodulator being configured to combine complex MR data sets acquired via the two or more receiving coils.

7. The device of claim 1, wherein the MR imaging sequence is a Balanced Fast Field Echo (BFFE) sequence, an Inversion Recovery (IR) sequence, or a sequence for a phase-contrast measurement.

8. The device of claim 1, wherein MR signals from species with different chemical shift, such as water and fat, are simultaneously acquired.

9. A method for MRI of at least a portion of a body placed in an examination volume of an MR device the method comprising the following steps:
a) generating a series of MR signals by subjecting at least a portion of the body to an MR imaging sequence of at least one RE pulse and switched magnetic field gradients,
b) acquiring the MR signals as a plurality of k-space blades according to the PROPELLER scheme, the k-space blades being rotated about a center of k-space,
c) computing phase errors from the phase differences of two or more k-space blades having different rotation angles,
d) performing a phase correction of the acquired k-space blades on the basis of the computed phase errors,
e) reconstructing an MR image from the acquired and phase-corrected MR data set, and
f) combining two or more complex MR data sets for image reconstruction in step e), the MR data sets being acquired via different receiving coils in parallel.

10. A device for generating a magnetic resonance image of a body disposed in a magnetic resonance imaging volume, the device comprising:
one or more processors programmed to:
receive a series of magnetic resonance signals from a subject in a magnetic resonance examination volume as a plurality of k-space blades according to a PROPELLER scheme, the k-space blades being rotated to have different rotation angles,
transforming a pair of k-space blades at different rotation angles to image space to generate image space data sets $m_1(x, y)$ and $m_2(x, y)$, wherein $$m_1(x,y)=(m(x,y)*s(x,y))e^{+ip(x,y)}$$

$$m_2(x,y)=(m(x,y)*s(x,y))e^{-ip(x,y)}$$

where $m(x, y)$ denotes magnetization as a function of spatial coordinates x and y, $s(x, y)$ denotes a k-space shutter function, and $p(x\ y)$ denotes gradient-caused phase errors in image space;
separating the gradient caused phase $p(x\ y)$ from the subject in the examination volume and coil phases contained in $m(x, y)$ by computing:

$$\sqrt{m_1(x,y)m_2^*(x,y)}=|m(x,y)*s(x,y)|e^{ip(x,y)}$$

where $m_2^*(x, y)$ is a complex conjugate of $m_2(x, y)$,
phase correcting the acquired k-space blades on the basis of the gradient caused phase $p(x\ y)$,
reconstruct the phase corrected k-space blades into a magnetic resonance image.

11. The device of claim 10, wherein the received series of magnetic resonance signals were acquired by a plurality of receive coils in parallel and wherein the reconstruction uses a parallel reconstruction technique.

12. The device of claim 10, wherein the received series of MR images were generated using a Balanced Fast Field Echo (FFFE) imaging sequence or an Inversion Recovery (IR) imaging sequence.

13. The device of claim 10, wherein the series of MR signals from the body are simultaneously acquired from at least two species in the body with different chemical shifts.

14. The device of claim 10, wherein the transformed k-space blades are oriented oppositely.

15. A method for magnetic resonance imaging of at least a portion of a body placed in an examination volume of an MR device, the method comprising:
a) receiving MR signals as a plurality of k-space blades which were generated by subjecting at least a portion of the body to a PROPELLER MR imaging sequence of RE pulses and switched magnetic field gradients, the k-space blades being rotated about a central region of k-space,
b) computing gradient phase errors from the phase differences of pairs of the k-space blades having different rotation angles,
c) performing a phase correction of the acquired k-space blades on the basis of the computed phase errors, and
d) reconstructing an MR image form the phase-corrected k-space blades.

16. The method of claim 15, wherein a complex MR image is reconstructed from the acquired and phase-corrected MR data set.

17. The method of claim 15, wherein the gradient phase errors are computed from phase differences of k-space blades having opposing rotation angles.

18. A non-transitory computer readable medium carrying software for controlling one or more processors to perform the method of claim 15.

19. A processor programmed to perform h method of claim 15.

* * * * *